(12) United States Patent
Maruthamuthu et al.

(10) Patent No.: US 11,521,793 B2
(45) Date of Patent: Dec. 6, 2022

(54) RESONANT LC TANK PACKAGE AND METHOD OF MANUFACTURE

(71) Applicant: Intel Corporation, Santa Clara, CA (US)

(72) Inventors: Saravana Maruthamuthu, Munich (DE); Andreas Augustin, Munich (DE); Andreas Wolter, Regensburg (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/122,351

(22) Filed: Dec. 15, 2020

(65) Prior Publication Data

US 2021/0104359 A1    Apr. 8, 2021

Related U.S. Application Data

(63) Continuation of application No. 15/910,820, filed on Mar. 2, 2018, now Pat. No. 10,896,780.

(51) Int. Cl.
| | |
|---|---|
| *H01F 27/28* | (2006.01) |
| *H01F 27/40* | (2006.01) |
| *H01G 4/30* | (2006.01) |
| *H01G 4/005* | (2006.01) |
| *H01G 4/40* | (2006.01) |

(Continued)

(52) U.S. Cl.
CPC ......... *H01F 27/40* (2013.01); *H01F 27/2804* (2013.01); *H01F 41/041* (2013.01); *H01G 4/005* (2013.01); *H01G 4/30* (2013.01); *H01G 4/40* (2013.01); *H01L 23/528* (2013.01); *H01L 23/5223* (2013.01); *H01L 23/5226* (2013.01); *H01L 23/5227* (2013.01); *H01L 21/02164* (2013.01); *H01L 21/02203* (2013.01); *H01L 21/02274* (2013.01); *H01L 21/2885* (2013.01); *H01L 21/31111* (2013.01); *H01L 21/76802* (2013.01); *H01L 21/76877* (2013.01);

(Continued)

(58) Field of Classification Search
CPC ..... H01F 27/2804; H01F 41/041; H01G 5/40; H01L 23/5227
See application file for complete search history.

(56) References Cited

U.S. PATENT DOCUMENTS

2006/0049481 A1    3/2006 Tiemeijer et al.
2006/0207965 A1    9/2006 Pradeep et al.
(Continued)

OTHER PUBLICATIONS

"U.S. Appl. No. 15/910,820, Non Final Office Action dated Jun. 9, 2020", 14 pgs.

(Continued)

*Primary Examiner* — Scott Bauer
(74) *Attorney, Agent, or Firm* — Schwegman Lundberg & Woessner, P.A.

(57) ABSTRACT

A package on a die having a low resistive substrate, wherein the package comprises an inductor on low-k dielectric and a capacitor on high-k dielectric. The stacked arrangement having different dielectric materials may provide an inductor having a high Q-factor while still having a high capacitance density. In addition, moving the inductor from the die to the package and fabricating the high density capacitor on the package reduces the silicon area required permitting smaller RF/analog blocks on the chip.

24 Claims, 8 Drawing Sheets

(51) Int. Cl.
    *H01F 41/04*     (2006.01)
    *H01L 23/522*     (2006.01)
    *H01L 23/528*     (2006.01)
    *H01L 23/532*     (2006.01)
    *H03B 5/08*     (2006.01)
    *H01L 21/02*     (2006.01)
    *H01L 21/311*     (2006.01)
    *H01L 21/288*     (2006.01)
    *H01L 21/768*     (2006.01)

(52) U.S. Cl.
    CPC .... *H01L 23/5329* (2013.01); *H01L 23/53228* (2013.01); *H03B 5/08* (2013.01)

(56) References Cited

U.S. PATENT DOCUMENTS

| | | |
|---|---|---|
| 2007/0126543 A1* | 6/2007 | Yeh ................. H01L 23/5227 336/200 |
| 2015/0115404 A1* | 4/2015 | Hsueh ............... H01L 23/5223 257/531 |
| 2017/0110420 A1 | 4/2017 | Cheng et al. |
| 2019/0272950 A1 | 9/2019 | Maruthamuthu et al. |

OTHER PUBLICATIONS

"U.S. Appl. No. 15/910,820, Notice of Allowance dated Sep. 16, 2020", 8 pgs.

"U.S. Appl. No. 15/910,820, Response filed Sep. 9, 2020 to Non Final Office Action dated Jun. 9, 2020", 11 pgs.

\* cited by examiner

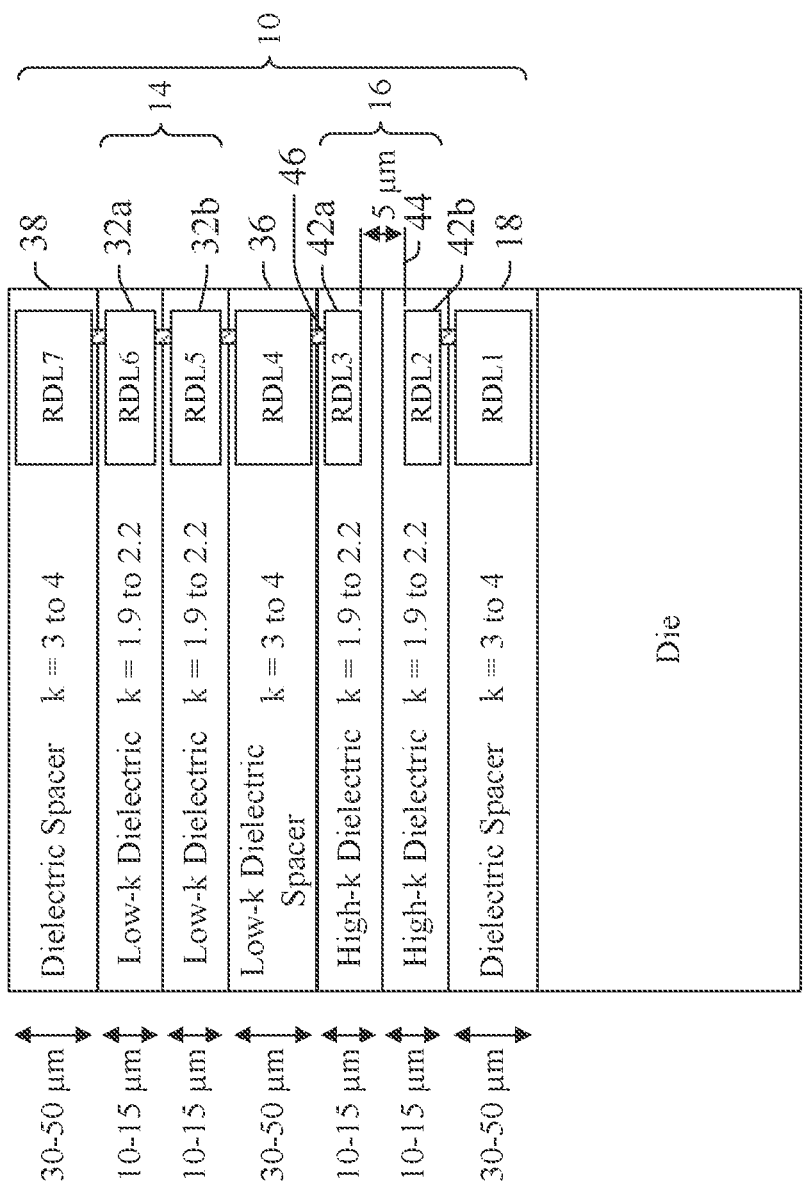

RESONANT LC TANK PACKAGE AND METHOD OF MANUFACTURE

PRIORITY

This application is a continuation of U.S. patent application Ser. No. 15/910,820, filed Mar. 2, 2018, which is incorporated herein by reference in its entirety.

TECHNICAL FIELD

This document pertains generally, but not by way of limitation, to packages having high-quality factor inductors and high-density capacitors for resonant LC tanks.

BACKGROUND

Certain circuits, such as LC-Phase locked loops and voltage controlled oscillators used in datacenters and wireless transceivers, require high quality factors ("Q-factor") (e.g. greater than 30) inductors and capacitors having low phase noise.

Inductor integrated circuits ("IC") produced by complementary metal-oxide-semiconductor ("CMOS") processes are commonly realized by fabricating low-k dielectric layers over p-doped low resistive silicone substrate. The upper low-k dielectric layers may be etched and thick-metal layers are inset into the low-k dielectric layers, where the metal layers are separated by dielectric material to form an inductor. The inductor produced by these processes are commonly in close proximity to the low resistive substrate (e.g. less than 1-3 μm), which can cause magnetic and capacitive coupling between the inductor and the low resistive substrate. The magnetic and capacitive coupling causing energy to dissipate within the low-resistive substrate and reduces the resonant frequency, which cause to the inductors formed by these process to have low Q-factors (e.g. 5-20).

As such, the inductors produced by these processes are unsuitable for high Q-factor applications.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5C is a schematic diagram of the fabrication of a inductor on a capacitor of FIG. 5B according to an example of the present disclosure.

DETAILED DESCRIPTION

The present inventors have recognized, among other things, that a problem to be solved can include providing inductor-capacitor ("LC") circuits having a high Q-factor inductor and a high density capacitors to reduce the noise to signal power ratio. In an example, the present subject matter may provide a solution to this problem, such as by fabricating over the low-k dielectric layers of a die, wherein the package comprises an inductor formed on low-k dielectric and a capacitor formed on high-k dielectric. The stacked arrangement having different dielectric materials may provide an inductor having a high Q-factor while still maintaining a high capacitance density. In addition, moving the inductor from the die to the package and fabricating the high density capacitor on the package reduces the silicon area required permitting smaller RF/analog blocks on the chip.

This overview is intended to provide an overview of subject matter of the present patent application. It is not intended to provide an exclusive or exhaustive explanation of the present subject matter. The detailed description is included to provide further information about the present patent application.

Figure 1:
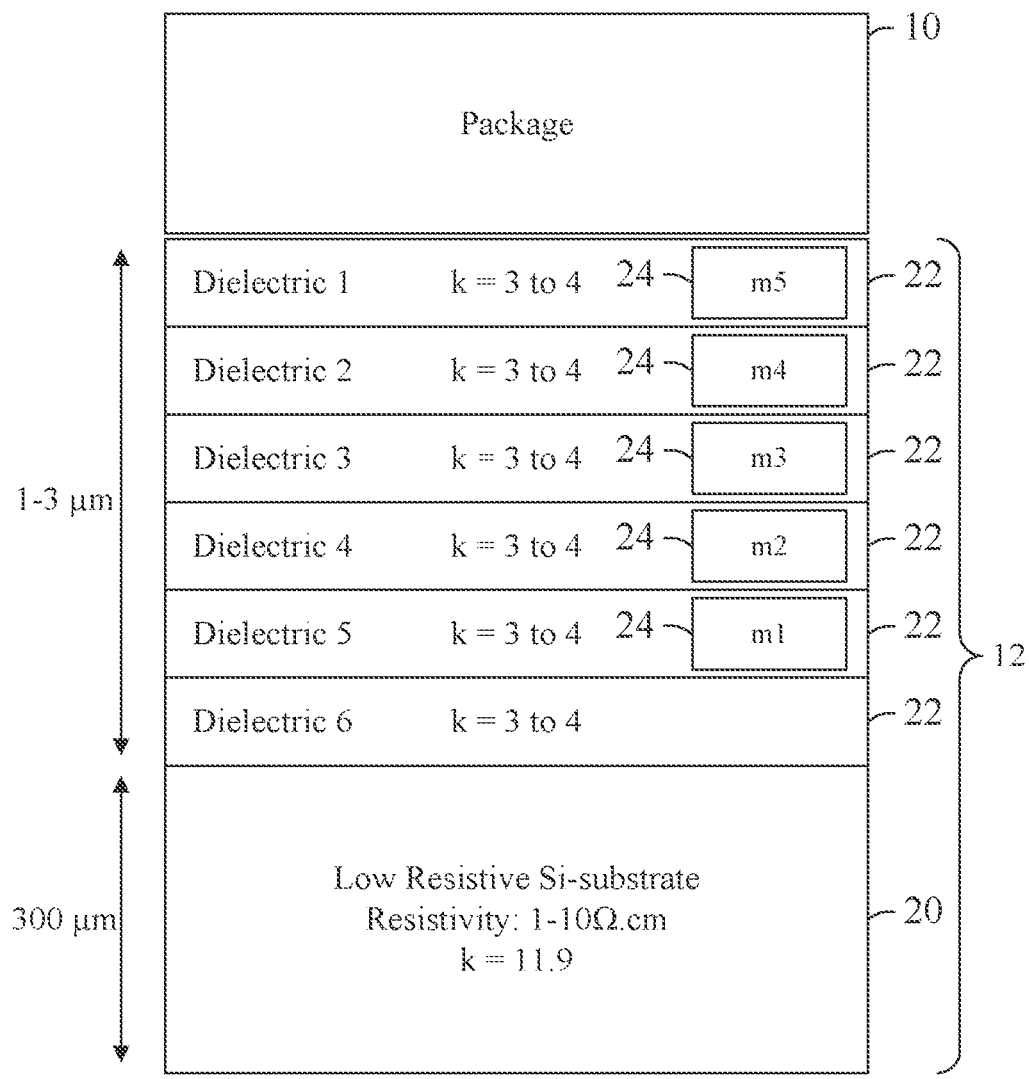
FIG. 1 is a schematic diagram of a die having a low-resistive substrate with a package fabricated thereon according to an example of the present disclosure.
Figure 2:
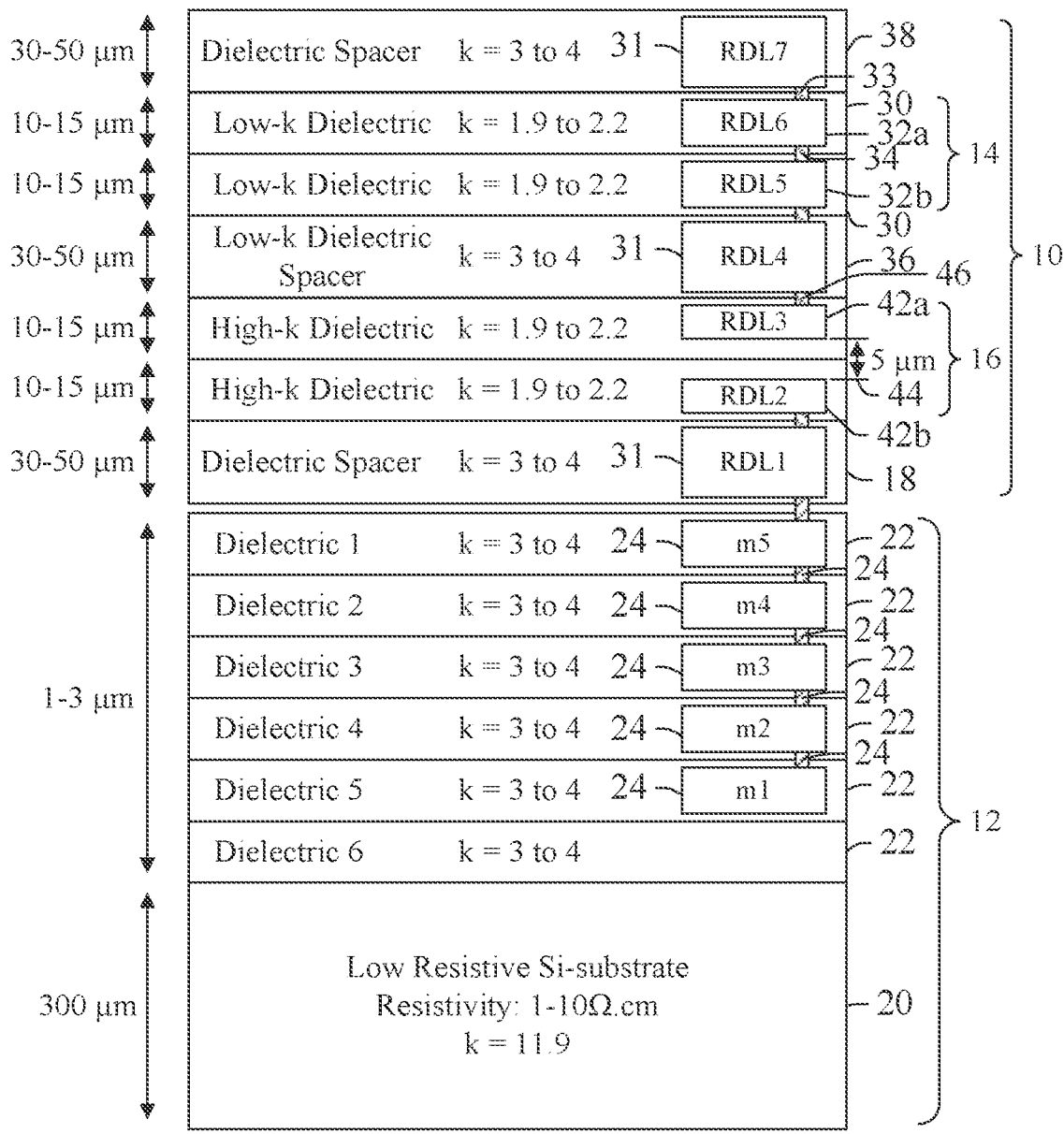
FIG. 2 is a schematic diagram of a die having a low-resistive substrate with an LC package fabricated thereon according to an example of the present disclosure.

As illustrated in FIGS. 1 and 2, an LC package 10, according to an example of the present disclosure, may be fabricated over a die 12. The LC package 10 may include an inductor 14 on low-k dielectric and a capacitor 16 on high-k dielectric, wherein the capacitor 16 is positioned between the inductor 14 and the die 12. In an example, a dielectric spacer 18 may be positioned between the capacitor 16 and the die 12 to further isolate the inductor 14 and the capacitor 16 from the die 12.

The die 12 may comprise a low-resistive substrate 20 and at least one low-k dielectric layer 22 fabricated thereon. The low-resistive substrate 20 may comprise a p-doped silicon having a resistivity of about of about 1 to about 10 Ω·cm. Each low-k dielectric layer 22 may comprise, but is not limited to un-doped silicon dioxide or fluorine or carbon-doped silicon dioxide. In at least one example, the silicon dioxide may have a porous structure. The low-resistive substrate 20 may comprise a k of about 11.5 to about 12.5, while each low-k dielectric layer 22 may have a k of about 3 to about 4.

As illustrated in FIG. 1, in an example, the low-resistive substrate 20 may have a thickness of about 300 μm, whereas the combined thickness of the low-k dielectric layers 22 may have a thickness of about 1 to about 3 μm. As illustrated in FIGS. 1-2, in at least one example, at least one low-k dielectric layer 22 may comprise a metal layer 24 (m1 to m5), which are interconnected by vertical interconnections 26 etched through the low-k dielectric layers 22.

Magnetic Coupling

As illustrated in FIG. 2, the inductor 14 may comprise at least one a low-k dielectric layer 30 and two metal layers 32a, 32b connected by a vertical interconnection 34. The capacitor 16 may comprise at least one high-k dielectric layer 40 and a pair of metal plates 42a, 42b spaced apart to form a gap 44 there between. The gap 44 may be about 5 μm in width with high-k dielectric material therein. The overall thickness of the capacitor 14 may be between about 20 to about 30 μm.

Magnetic coupling may form between the inductor 14 and the low resistive substrate 20 thereby inducing induces eddy currents passing through the low-resistive substrate 20 causing energy to be dissipated within the low-resistive substrate 20. Conventional CMOS inductors may be fabricated as part of the die 12 (e.g. metal layers 24, m4 and m5) thereby placing the CMOS inductor within 1 to 3 μm of the low-resistive substrate 20 resulting in significant magnetic coupling between the inductor and the low-resistive substrate 20. While substituting the low-k dielectric layers 22 of the die 12 with high resistive silicon and silicon covered insulators will reduce magnetic coupling, the substitute materials substantially increase the costs of the die 12. The positioning of inductor 14 as part of the LC package 10 increases the distance between the inductor 14 and the low-resistive substrate 20 without significantly increasing costs of the die 12.

As illustrated in FIG. 2, in an example, the capacitor 16 is positioned between the inductor 14 and the die 12. More specifically, the capacitor 16 is positioned between the inductor 14 and the low-resistive substrate 20 to further increase the distance between the low-resistive substrate 20 and the inductor 14 thereby further reducing the magnetic coupling there between. Placing the capacitor 16 between the inductor 14 and the low-resistive substrate 20 may increase the distance between the inductor 14 and the low-resistive substrate 20 by at least about 20 to 30 μm as compared to the 1 to 3 μm spacing found in conventional CMOS inductors.

As illustrated in FIG. 2, the dielectric spacer 18 may be positioned within the LC package 10 such that the dielectric spacer 18 is positioned between the capacitor 16 and die 12 to further increase the distance between the inductor 14 and the low-resistive substrate 20. In at least one example, the LC package 10 may further include a low-k dielectric spacer 36 positioned between the inductor 14 and the capacitor 16. The dielectric spacer 18 and the low-k dielectric spacer 36 may each have a thickness of between about 30 to about 50 μm, which further increases the distance between the inductor 12 and the low-resistivity substrate 20 thereby further reducing the magnetic coupling there between. In at least one example, the dielectric spacer 18 and the low-k dielectric spacer 36 with the capacitor 16 may combine to increase distance of the inductor 14 from the low-resistive substrate 20 by at least about 80 to 130 μm as compared to the 1 to 3 μm spacing found in conventional CMOS inductors.

Capacitive Coupling

In addition to magnetic coupling, the inductor 14 may be electrically coupled to the low-resistivity substrate 20 through parasitic capacitance $C_{OX}$. The increased distance between the inductor 14 and the low-resistive substrate 20 provided by the positioning of the capacitor 16 may reduce the capacitive coupling between the inductor 14 and the low-resistivity substrate 20. Similarly, the increased distance provided by the dielectric spacer 18 or the low-k dielectric spacer 36 further reduces the capacitive coupling between the inductor 14 and the low-resistivity substrate 20.

As illustrated in FIG. 2, in an example, the low-k dielectric layer 30 of the inductor 14 may comprise a k of about 1.5 to about 2.5 and, in certain examples, about 1.9 to about 2.2. The low-k dielectric layer 30 may comprise, but is not limited to un-doped silicon dioxide; F-doped, C-doped, and H-doped oxides; polyimides; aromatic polymers; vapor-deposited parylene; F-doped amorphous carbon; polytetrafluoroethylene; xerogels and aerogels; and air. In at least one example, the low-k dielectric layer 30 may comprise a porous structure. In CMOS inductors, the k of the inductor layers may be higher (e.g. 3-4) creating a large capacitance between the inductor and the substrate. The low-k dielectric layer 30 of the inductor 14 of the present disclosure further reduces the capacitance between the inductor 14 and the low-resistivity substrate 20 and avoids the formation of a parasitic resonant LC tank on the die 12.

Figure 3A:
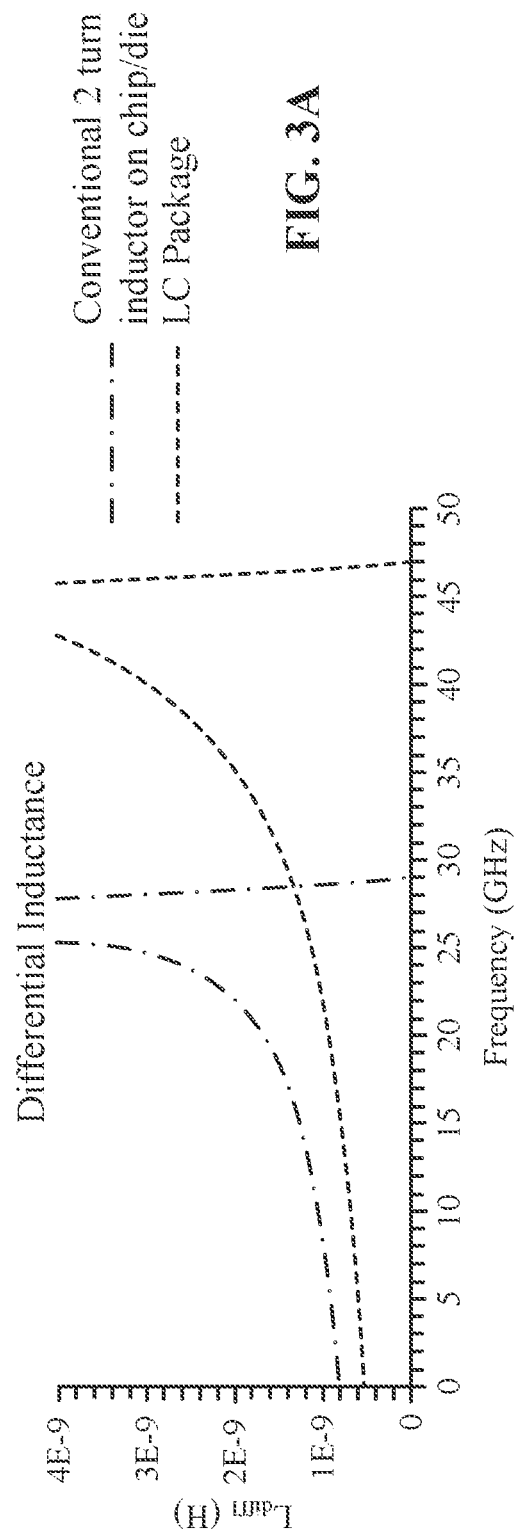
FIG. 3A is a graphical representation of the improved differential inductance of an LC package as compared to a conventional inductor on a chip according to an example of the present disclosure.

The reduced capacitive coupling between the inductor 14 and the low-resistivity substrate 20 results in an increased resonant frequency of the inductor 14. The resonant frequency $F_{res}$ of the inductor 14 may be expressed as:

$$F_{res} \approx \frac{1}{2\pi\sqrt{L_2 C_{OX}}}$$

where L is the inductance. As illustrated in FIG. 3A, the reduced parasitic capacitance $C_{OX}$ provided by the increased separation of the inductor 14 from the low-resistivity substrate 20 and the low k of the low-k dielectric layer 30 of the inductor 14 provides a greater resonant frequency when compared to conventional CMOS inductors.

Figure 3B:
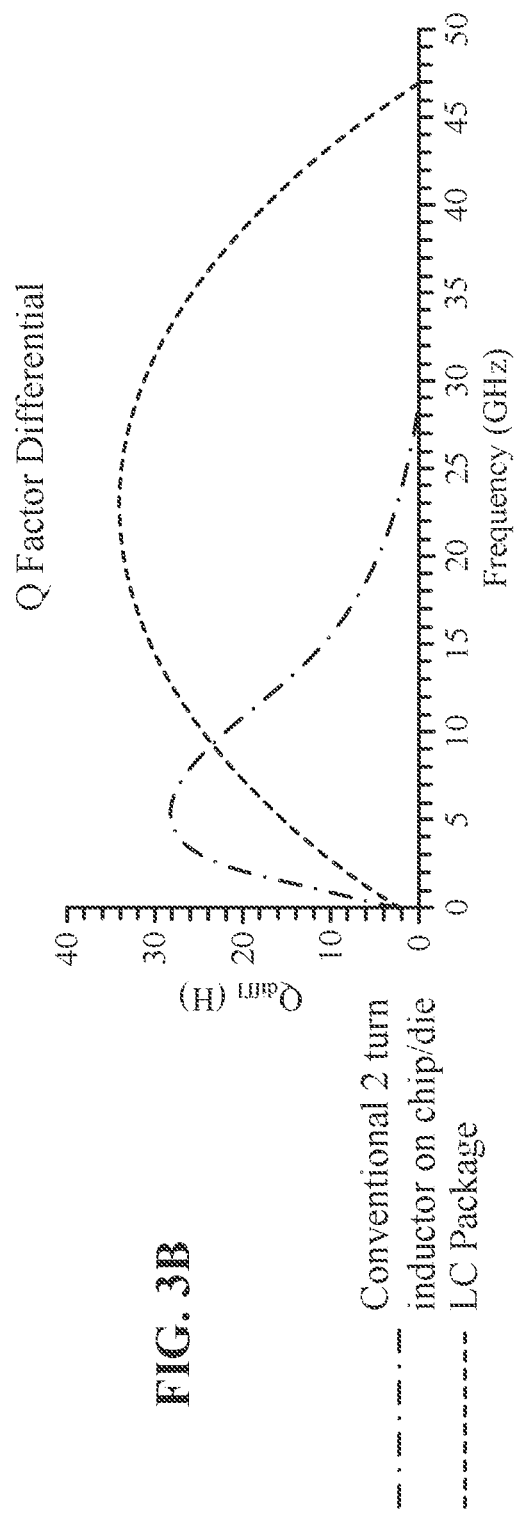
FIG. 3B is a graphical representation of the improved Q-factor differential of an LC package as compared to a conventional inductor on a chip according to an example of the present disclosure.

In addition, the reduced capacitive coupling between the inductor 14 and the low-resistivity substrate 20 also results in an increased Q factor. The Q-factor $Q_f$ may be expressed as:

$$Q_f = R\sqrt{\frac{C}{L}}$$

wherein R is the impedance. As illustrated in FIG. 3B, the reduced parasitic capacitance $C_{OX}$ provided by the increased separation of the inductor 14 from the low-resistivity substrate 20 and the low k of the low-k dielectric layer 30 of the inductor 14 provides a greater Q factor when compared to conventional CMOS inductors.

The greater Q factor correspondingly reduces the noise to signal power ratio. The noise-to-signal power ratio may be expressed as:

$$\frac{N}{S} = \frac{\omega k T}{Q P_{diss}}$$

where N is the noise, S is the signal power, ω is the angular frequency, k is the Boltzmann constant, T is the temperature, and $P_{diss}$ is the dissipated power. The reduced noise to signal power ratio provides an electrical advantage that permits the creation of low power phase lock-loops for datacenters and low power wireless transceivers.

As illustrated in FIG. 1, in at least one example, each dielectric layer of the LC package 10 may comprise a redistribution metal layer 31 (RDL1 to RDL7), which may be connected to each other by vertical interconnections 33, 46.

As illustrated in FIGS. 3A-3B, in at least one example, the metal layers 32a, 32b of the inductor 14 may be arranged in a 2 turn, 2 metal inductor arrangement. As illustrated, each metal layer 32a, 32b may be received within a low-k dielectric layer 30 having a thickness of about 10-15 μm. The overall thickness of the inductor 14 may be between about 20 to about 30 μm.

As illustrated in FIG. 2, in at least one example, the LC package 10 may further include a top dielectric spacer 38 fabricated over the inductor 14. The top dielectric spacer 38 can have a k-constant of about 2 to about 5 and, in certain examples, about 3 to about 4. As illustrated in FIG. 2, in at least one example, the top dielectric spacer 38 may have a thickness of between about 30 to about 50 μm.

High Capacity Capacitor

Figure 4A:
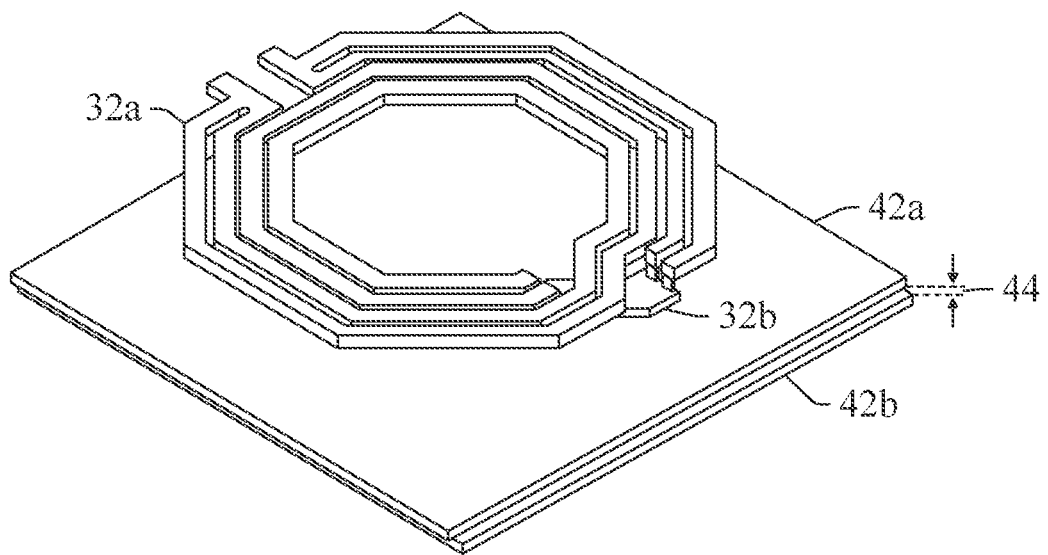
FIG. 4A is a front perspective view of an LC package according to an example of the present disclosure.
Figure 4B:
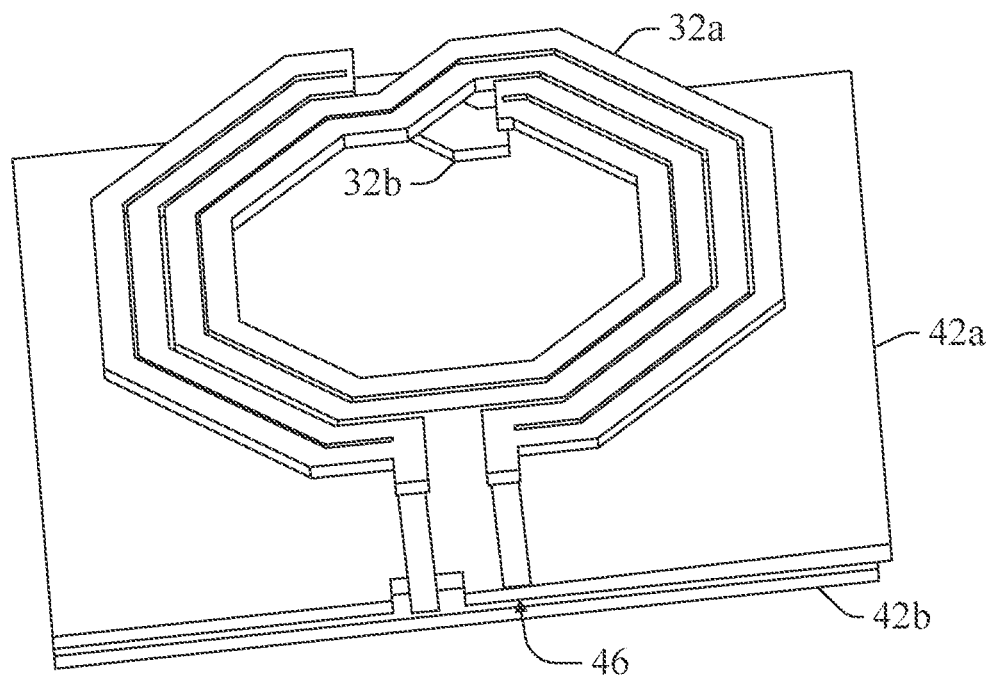
FIG. 4B is a back perspective view of an LC package according to an example of the present disclosure.

As illustrated in FIG. 2, in an example, the capacitor 16 may comprise at least one high-k dielectric layer 40 and a pair of metal plates 42a, 42b spaced apart to define a gap 44 there between. As illustrated in FIG. 4B, in at least one example, the metal plates 42a, 42b may be arranged in a parallel plate arrangement. The capacitance of the capacitor 16 in a parallel plate arrangement may be expressed as:

$$C = \frac{k\varepsilon_0 A}{d}$$

where k is the dielectric constant, $\varepsilon_0$ is the electric constant, A is the overlapping area of the plates 42a, 42b, and d is the distance between the plates 42a, 42b. While increasing the area of the plates 42a, 42b improves overall capacitance of the capacitor 16, the increase in the area of the capacitor 16 increases the overall size of the LC package 10 and the underlying die 12, which increases the manufacturing costs.

As illustrated, each metal layer 42a, 42b may be received within a high-k dielectric layer 40 having a thickness of about 10-15 μm. The high-k dielectric layer 40 can have a k-constant of about 5 to about 15 and, in certain examples, about 8 to about 11. The high-k dielectric layer 40 may comprise, but is not limited to silicon dioxide, zirconium dioxide, hafnium dioxide, yttrium oxide, and aluminum trioxide. The high-k dielectric layer 40 increases the capacitance of the capacitor 16 without increasing the overall area of the capacitor 14 and correspondingly the overall area of the LC package 10 and the underlying die 12.

While the high-k dielectric layer 40 increases the capacitance per unit area without increasing the plate area, the increased high-k correspondingly decreases the Q-factor and resonant frequency. The decreased Q-factor and resonant frequency caused by the high-k dielectric layer 40 are offset by the increased Q-factor and resonant frequency provided by the increased spacing between the inductor 14 and the low-resistivity substrate 20. Specifically, the positioning of the capacitor 16 and the dielectric spacer 18 and/or the low-k dielectric spacer 36 between the inductor 14 and low-resistivity substrate 20 provides a net increase in Q-factor and resonant frequency for the LC tank 10.

As illustrated in FIGS. 2 and 4B, in at least one example, the inductor 14 may be connected to the capacitor 16 by a vertical interconnection 46. As illustrated, the inductor 14 may be connected to the capacitor 16 in parallel. The inductor 14 may be connected to the capacitor 16 in parallel or series.

Figure 5A:
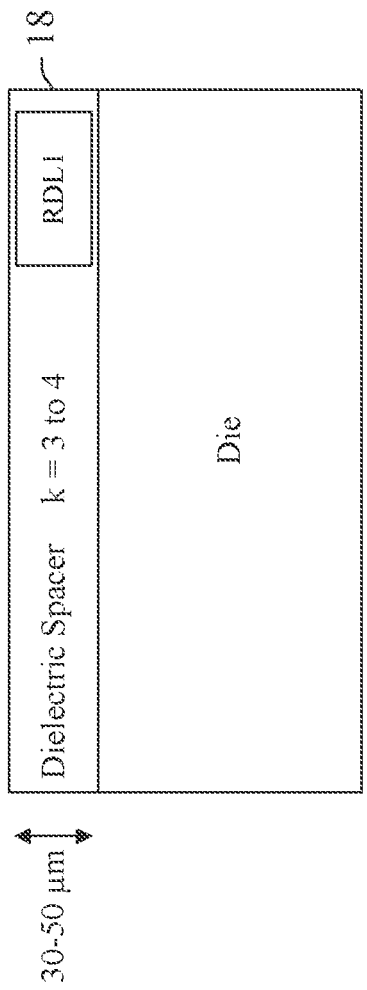
FIG. 5A is a schematic diagram of the fabrication of a dielectric spacer on a die according to an example of the present disclosure.
Figure 5B:
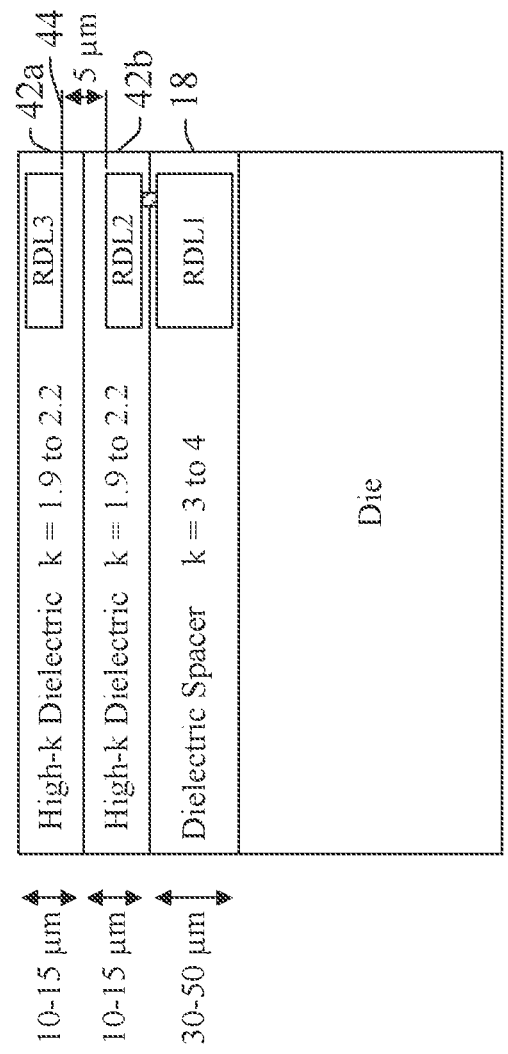
FIG. 5B is a schematic diagram of the fabrication of a conductor on the dielectric spacer of FIG. 5A according to an example of the present disclosure.

As shown in FIGS. 5A-C, a method 100 of fabricating an LC package 10 on a die 12 according to an example of the present disclosure, can comprise fabricating a dielectric spacer step 102, fabricating a capacitor step 104, and fabricating an inductor step 106.

In an example, the die 12 may be prepared through doping and thermal oxidation of a silicon wafer to form at least one low-k dielectric layer 22 over a low-resistive silicon substrate 20. In at least one example, the low-k dielectric layers 22 may be deposited on the low-resistive silicon substrate 20 through plasma enhanced chemical vapor deposition ("PECVD") or other techniques. The low-k dielectric layer 22 may comprise silicon dioxide that is un-doped or doped with fluorine or carbon. In at least one example, the low-k dielectric layer 22 may be corroded through an anodization technique or etched with a corrosive such that the low-k dielectric layer 22 has a porous structure. In at least one example, each low-k dielectric layer 22 may be etched to form a three-dimensional structure and a metal (e.g. copper) is electroplated onto the die 12 to form the metal layers 24 and vertical interconnections 26.

As shown in FIG. 5A, the fabrication of the dielectric spacer step 102 may comprise fabricating the dielectric spacer 18 over the die 12 by depositing a low-k material on the die 12. The dielectric spacer 18 may comprise low-k dielectric material including, but not limited to un-doped silicon dioxide; F-doped, C-doped, and H-doped oxides; polyimides; aromatic polymers; vapor-deposited parylene; F-doped amorphous carbon; polytetrafluoroethylene; xerogels and aerogels; and air. As illustrated in FIG. 2, the dielectric spacer 18 may be fabricated on the uppermost dielectric layer 22. The dielectric spacer 18 can have a k of about 2 to about 5 and, in certain examples, about 3 to about 4. As illustrated in FIG. 2, in at least one example, the dielectric spacer 18 may have a thickness of between about 30 to about 50 μm.

As shown in FIG. 5B, the fabrication of the capacitor step 104 may comprise fabricating the capacitor 16 over the dielectric spacer 18. The capacitor 16 may be fabricated by depositing a high-k dielectric material on the dielectric spacer 18 to form a high-k dielectric layer 40. The high-k dielectric material may comprise, but is not limited to silicon dioxide, zirconium dioxide, hafnium dioxide, yttrium oxide, and aluminum trioxide. A first metal layer 42a may be electroplated onto the high-k dielectric layer 40 before additional high-k dielectric material is deposited onto the first metal layer 42a. A second metal layer 42b may be electroplated onto the high-k dielectric layer 40 to form a gap 44 between the metal layers 42a, 42b. In at least one example, the method 100 may further comprise depositing additional low-k dielectric material over the capacitor 16 to fabricating an additional low-k dielectric spacer 36 over the capacitor 16.

As shown in FIG. 5C, the fabrication of the inductor step 106 may comprise fabricating the inductor 14 over the capacitor 16. The inductor step 106 may be fabricated by depositing a low-k dielectric material on the capacitor 16 or the low-k dielectric spacer 36 to form a low-k dielectric layer 30. Each low-k dielectric layer 30 may be etched to form a three-dimensional structure and a metal (e.g. copper) is electroplated onto the low-k dielectric layer 30 to form metal layers 32a, 32b. In at least one example, the metal layers 32a, 32b may be formed into a 2 turn, 2 metal inductor arrangement. In at least one example, the method 100 may further comprise depositing additional low-k dielectric material over the inductor 14 to fabricating a top low-k dielectric spacer 38 over the inductor 14.

Figure 6:
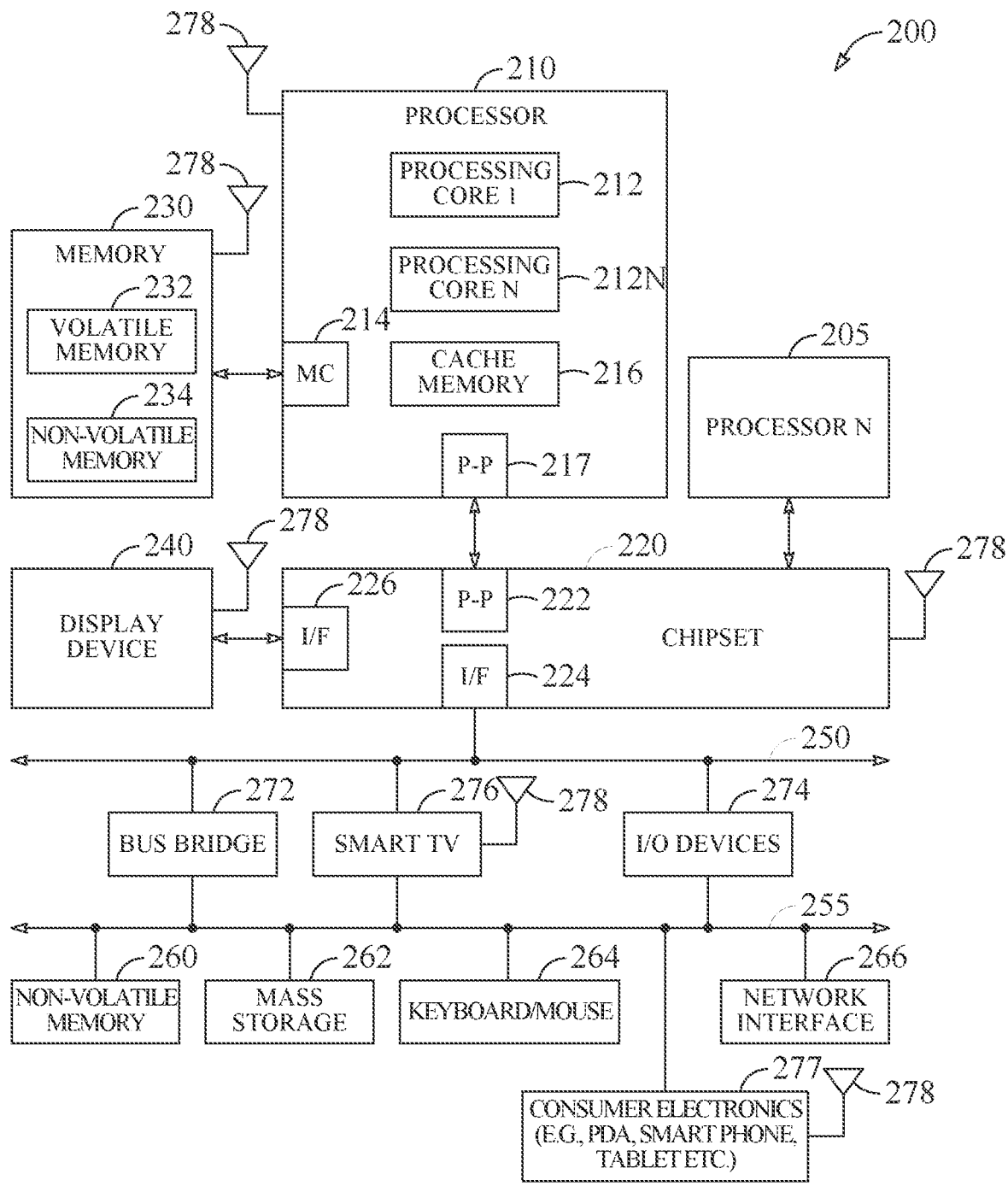
FIG. 6 illustrates a system level diagram, depicting an example of an electronic device (e.g., system) including the LC package according to an example of the present disclosure.

FIG. 6 is included to show an example of a higher level device application for the LC package 10. In one embodiment, system 200 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 200 is a system on a chip (SOC) system.

In one embodiment, processor 210 has one or more processor cores 212 and 212N, where 212N represents the Nth processor core inside processor 210 where N is a positive integer. In one embodiment, system 200 includes multiple processors including 210 and 205, where processor 205 has logic similar or identical to the logic of processor 210. In some embodiments, processing core 212 includes, but is not limited to, pre-fetch logic to fetch instructions, decode logic to decode the instructions, execution logic to execute instructions and the like. In some embodiments, processor 210 has a cache memory 216 to cache instructions and/or data for system 200. Cache memory 216 may be organized into a hierarchal structure including one or more levels of cache memory.

In some embodiments, processor 210 includes a memory controller 214, which is operable to perform functions that enable the processor 210 to access and communicate with memory 230 that includes a volatile memory 232 and/or a non-volatile memory 234. In some embodiments, processor 210 is coupled with memory 230 and chipset 220. Processor 210 may also be coupled to a wireless antenna 278 to communicate with any device configured to transmit and/or receive wireless signals. In one embodiment, an interface for wireless antenna 278 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 232 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 234 includes, but is not limited to, flash memory, phase change memory (PCM), read-only memory (ROM), electrically erasable programmable read-only memory (EEPROM), or any other type of non-volatile memory device.

Memory 230 stores information and instructions to be executed by processor 210. In one embodiment, memory 230 may also store temporary variables or other intermediate information while processor 210 is executing instructions. In the illustrated embodiment, chipset 220 connects with processor 210 via Point-to-Point (PtP or P-P) interfaces 217 and 222. Chipset 220 enables processor 210 to connect to other elements in system 200. In some embodiments of the example system, interfaces 217 and 222 operate in accordance with a PtP communication protocol such as the Intel® QuickPath Interconnect (QPI) or the like. In other embodiments, a different interconnect may be used.

In some embodiments, chipset 220 is operable to communicate with processor 210, 205N, display device 240, and other devices, including a bus bridge 272, a smart TV 276, I/O devices 274, nonvolatile memory 260, a storage medium (such as one or more mass storage devices) 262, a keyboard/mouse 264, a network interface 266, and various forms of consumer electronics 277 (such as a PDA, smart phone, tablet etc.), etc. In one embodiment, chipset 220 couples with these devices through an interface 224. Chipset 220 may also be coupled to a wireless antenna 278 to communicate with any device configured to transmit and/or receive wireless signals.

Chipset 220 connects to display device 240 via interface 226. Display 240 may be, for example, a liquid crystal display (LCD), a light emitting diode (LED) array, an organic light emitting diode (OLED) array, or any other form of visual display device. In some embodiments of the example system, processor 210 and chipset 220 are merged into a single SOC. In addition, chipset 220 connects to one or more buses 250 and 255 that interconnect various system elements, such as I/O devices 274, nonvolatile memory 260, storage medium 262, a keyboard/mouse 264, and network interface 266. Buses 250 and 255 may be interconnected together via a bus bridge 272.

In one embodiment, mass storage device 262 includes, but is not limited to, a solid state drive, a hard disk drive, a universal serial bus flash memory drive, or any other form of computer data storage medium. In one embodiment, network interface 266 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 200, the functions performed by some of these blocks may be integrated within a single semiconductor circuit or may be implemented using two or more separate integrated circuits. For example, although cache memory 216 is depicted as a separate block within processor 210, cache memory 216 (or selected aspects of 216) can be incorporated into processor core 212.

Various Notes & Examples

Example 1 is an LC package fabricated on a die having a low-resistive substrate, comprising: an inductor fabricated on low-k dielectric; a capacitor fabricated on high-k dielectric; and a dielectric spacer; wherein the inductor and the capacitor are fabricated over the dielectric spacer such that the dielectric spacer is positioned between the die and the inductor and capacitor.

In Example 2, the subject matter of Example 1 optionally includes that the low-k dielectric has a k-constant of about 1.5 to about 2.5 and a thickness of about 10 to about 15 μm.

In Example 3, the subject matter of any one or more of Examples 1-2 optionally include wherein the inductor comprises at least two metal layers shaped in two-turn, two metal arrangement.

In Example 4, the subject matter of any one or more of Examples 1-3 optionally include a low-k dielectric spacer positioned between the inductor and the capacitor; wherein the low-k dielectric spacer has a k-constant of about 5 to about 15 and a thickness of about 30 to about 50 μm.

In Example 5, the subject matter of any one or more of Examples 1-4 optionally include that the high-k dielectric has a k-constant of about 5 to about 15 and has a thickness of about 20 to about 30 μm.

In Example 6, the subject matter of any one or more of Examples 1-5 optionally include wherein the capacitor comprises two metal planes separated by a gap; wherein high-k dielectric is positioned within the gap and the gap has a thickness of about 5 µm.

In Example 7, the subject matter of any one or more of Examples 1-6 optionally include wherein the inductor and the capacitor are electrically connected by a via.

In Example 8, the subject matter of any one or more of Examples 1-7 optionally include that the dielectric spacer has a k-constant of about 2 to about 5 and has a thickness of between about 30 to about 50 µm.

In Example 9, the subject matter of any one or more of Examples 1-8 optionally include a top dielectric spacer fabricated over the inductor; wherein the top dielectric spacer has a k-constant of about 2 to about 5 and has a thickness of about 30 to about 50 µm.

Example 10 is a circuit on a chip, comprising: a die, including: a low-resistive substrate, and at least one dielectric layer fabricated over the low-resistive substrate; and a package fabricated on the die, including: an inductor fabricated on low-k dielectric; a capacitor fabricated on high-k dielectric; and a dielectric spacer; wherein the inductor and the capacitor are fabricated over the dielectric spacer such that the dielectric spacer is positioned between the die and the inductor and capacitor.

In Example 11, the subject matter of Example 10 optionally includes that the low-resistive substrate has a resistivity of about 1 to about 10 Ω·cm and a k-constant of about 11.5 to about 12.5.

In Example 12, the subject matter of any one or more of Examples 10-11 optionally include that the dielectric layer has a thickness of about 1 to about 3 µm.

In Example 13, the subject matter of any one or more of Examples 10-12 optionally include that the low-k dielectric has a k-constant of about 1.5 to about 2.5 and a thickness of about 10 to about 15 µm.

In Example 14, the subject matter of any one or more of Examples 10-13 optionally include wherein the inductor comprises at least two metal layers shaped in two-turn, two metal arrangement.

In Example 15, the subject matter of any one or more of Examples 10-14 optionally include a low-k dielectric spacer positioned between the inductor and the capacitor; wherein the low-k dielectric spacer has a k-constant of about 5 to about 15 and a thickness of about 30 to about 50 µm.

In Example 16, the subject matter of any one or more of Examples 10-15 optionally include that the high-k dielectric has a k-constant of about 5 to about 15 and has a thickness of about 20 to about 30 µm.

In Example 17, the subject matter of any one or more of Examples 10-16 optionally include wherein the capacitor comprises two metal planes separated by a gap; wherein high-k dielectric is positioned within the gap and the gap has a thickness of about 5 µm.

In Example 18, the subject matter of any one or more of Examples 10-17 optionally include wherein the inductor and the capacitor are electrically connected by a via.

In Example 19, the subject matter of any one or more of Examples 10-18 optionally include that the dielectric spacer has a k-constant of about 2 to about 5 and has a thickness of between about 30 to about 50 µm.

In Example 20, the subject matter of any one or more of Examples 10-19 optionally include a top dielectric spacer fabricated over the inductor; wherein the top dielectric spacer has a k-constant of about 2 to about 5 and has a thickness of about 30 to about 50 µm.

Example 21 is a method of fabricating an LC package, comprising: providing a die having a low-resistive substrate and a dielectric layer formed on the low-resistive substrate; fabricating a dielectric spacer over the dielectric layer; fabricating a conductor on high-k dielectric over the dielectric spacer such that the dielectric spacer is positioned between the conductor and the low-resistive substrate; and fabricating an inductor on low-k dielectric over the conductor such that the conductor and the dielectric spacer and positioned between the inductor and the low-resistive substrate.

In Example 22, the subject matter of Example 21 optionally includes fabricating a low-k dielectric spacer between the inductor and the capacitor.

In Example 23, the subject matter of any one or more of Examples 21-22 optionally include fabricating a top dielectric spacer over the inductor.

In Example 24, the subject matter of any one or more of Examples 21-23 optionally include that the low-k dielectric has a k-constant of about 1.5 to about 2.5 and a thickness of about 10 to about 15 µm.

In Example 25, the subject matter of any one or more of Examples 21-24 optionally include that the high-k dielectric has a k-constant of about 5 to about 15 and has a thickness of about 20 to about 30 µm.

Each of these non-limiting examples can stand on its own, or can be combined in any permutation or combination with any one or more of the other examples.

The above detailed description includes references to the accompanying drawings, which form a part of the detailed description. The drawings show, by way of illustration, specific embodiments in which the present subject matter can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the present subject matter should be determined with reference to the appended claims, along with the full scope of equivalents to which such claims are entitled.

What is claimed is:

1. A device, comprising:
a die;
an inductor included in a first layer of dielectric material, the first layer of dielectric having a first dielectric constant;
a capacitor included in a second layer of dielectric, the second layer of dielectric material having a second dielectric constant different than the first dielectric constant, wherein the capacitor is positioned between the inductor and the die, and the capacitor includes:
a first plate;
a second plate; and
wherein the second dielectric material having the second dielectric constant is located in a gap between the first plate and the second plate;
a via electrically connecting the inductor with one or more of the first plate or the second plate; and
a dielectric spacer positioned between the die and the inductor, and the dielectric spacer is positioned between the die and the capacitor.

2. The device of claim 1, wherein the first dielectric constant is about 1.5 to about 2.5.

3. The device of claim 2, wherein the second dielectric constant is about 5 to about 15.

4. The device of claim 1, wherein the inductor is electrically connected in series with the capacitor, or the inductor is electrically connected in parallel with the capacitor.

5. The device of claim 1, wherein the dielectric spacer is a first dielectric spacer, and the device further comprises:
a second dielectric spacer located between the inductor and the capacitor.

6. The device of claim 5, wherein one or more of the first dielectric spacer or the second dielectric spacer have a third dielectric constant of about 2 to about 5.

7. The device of claim 5, wherein:
the first layer is located on a first side of the second layer; and
the device includes a third dielectric spacer located on a second side of the second layer.

8. The device of claim 1, wherein:
the first layer is located on a first side of the second layer;
the dielectric spacer is a first dielectric spacer; and
the device includes a second dielectric spacer located on a second side of the second layer.

9. The device of claim 8, wherein one or more of the first dielectric spacer or the second dielectric spacer have a third dielectric constant of about 2 to about 5.

10. A substrate configured to couple with a die, comprising:
a first layer including:
a first dielectric material having a first dielectric constant; and
an inductor;
a second layer including:
a second dielectric material having a second dielectric constant, wherein the second dielectric constant is different than the first dielectric constant;
a capacitor, including:
a first plate;
a second plate spaced from the first plate by a gap; and
wherein the second dielectric material is located in the gap between the first plate and the second plate;
a via in electrical communication with the inductor and one or more of the first plate or the second plate; and
a dielectric spacer configured to separate the inductor and the capacitor from the die, wherein the capacitor is within a footprint of the inductor and a footprint of the dielectric spacer.

11. The substrate of claim 10, wherein the dielectric spacer is exposed on a surface of the substrate.

12. The substrate of claim 10, wherein the first dielectric constant is about 1.5 to about 2.5.

13. The substrate of claim 12, wherein the second dielectric constant is about 5 to about 15.

14. The substrate of claim 10, wherein the second dielectric constant is about 5 to about 15.

15. The substrate of claim 10, wherein the dielectric spacer has a third dielectric constant of about 2 to about 5.

16. The substrate of claim 10, wherein the dielectric spacer is a first dielectric spacer, and the device further comprises:
a second dielectric spacer located between the inductor and the capacitor.

17. The substrate of claim 16, wherein:
the first layer is located on a first side of the second layer; and
the device includes a third dielectric spacer located on a second side of the second layer.

18. The substrate of claim 10, wherein:
the first layer is located on a first side of the second layer;
the dielectric spacer is a first dielectric spacer; and
the device includes a second dielectric spacer located on a second side of the second layer.

19. The substrate of claim 10, further comprising a die coupled with the substrate.

20. An electronic device, comprising:
a die;
a package coupled with the die, the package including:
a first layer including:
a first dielectric material having a first dielectric constant; and
an inductor;
a second layer including:
a second dielectric material having a second dielectric constant, wherein the second dielectric constant is different than the first dielectric constant; and
a capacitor, including:
a first plate;
a second plate spaced from the first plate by a gap; and wherein the second dielectric material is located in the gap between the first plate and the second plate;

a via in electrical communication with the inductor and one or more of the first plate or the second plate; and a dielectric spacer separating the inductor and the capacitor from the die coupled with the package.

21. The electronic device of claim 20, wherein the die includes a die substrate having a resistivity of about 1 Ω·cm to about 10 Ω·cm.

22. The electronic device of claim 21, wherein the die substrate has a third dielectric constant of about 11.5 to about 12.5.

23. The electronic device of claim 20, wherein the first dielectric constant is about 1.5 to about 2.5.

24. The electronic device of claim 20, wherein the second dielectric constant is about 5 to about 15.

* * * * *